(12) United States Patent
McKee et al.

(10) Patent No.: US 6,218,311 B1
(45) Date of Patent: Apr. 17, 2001

(54) POST-ETCH TREATMENT OF A SEMICONDUCTOR DEVICE

(75) Inventors: Jeffrey A. McKee, Grapevine; Ming J. Hwang, Dallas; Chih-Chen Cho, Richardson; William R. McKee, Plano, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/334,992

(22) Filed: Jun. 17, 1999

Related U.S. Application Data
(60) Provisional application No. 60/091,294, filed on Jun. 30, 1998.

(51) Int. Cl.[7] ................................................. H01L 21/302
(52) U.S. Cl. ........................... 438/719; 438/720; 438/721
(58) Field of Search ..................................... 438/476, 720, 438/723, 756, 799, 421, 585, 595, 709, 660, 677, 303, 592

(56) References Cited

U.S. PATENT DOCUMENTS

| 5,425,843 | 6/1995 | Saul et al. ...................... 156/643.1 |
|---|---|---|
| 5,545,578 | * 8/1996 | Park et al. ........................... 438/592 |
| 5,612,249 | * 3/1997 | Sun et al. ............................. 438/297 |
| 5,925,918 | * 7/1999 | Wu et al. .............................. 257/413 |
| 5,998,290 | * 12/1999 | Wu et al. .............................. 438/595 |
| 6,048,791 | * 4/2000 | Katata et al. ........................ 438/655 |

OTHER PUBLICATIONS

Wolf et al.; Silicon Processing for the VLSI Era; vol. 1, p. 534, 1986.*

* cited by examiner

*Primary Examiner*—Benjamin L. Utech
*Assistant Examiner*—Duy-Vu Deo
(74) *Attorney, Agent, or Firm*—Wade James Brady, III; Frederick J. Telecky, Jr.

(57) ABSTRACT

Post-etch treatment of an etch-damaged semiconductor device includes forming a protective cover (48, 148) over an oxidizable section (18, 118) of the semiconductor device. The protective cover (48, 148) is operable to at least inhibit oxidation of the oxidizable section (18, 118). While the oxidizable section (18, 118) is covered, an oxide structure (52, 152) is formed. The oxide structure (52, 152) is operable to at least ameliorate etch damage to the semiconductor device.

20 Claims, 2 Drawing Sheets

POST-ETCH TREATMENT OF A SEMICONDUCTOR DEVICE

This applications claims priority under 35 USC §119(e)(1) of provisional application No. 60/091,294 filed Jun. 30, 1998.

TECHNICAL FIELD OF THE INVENTION

This invention relates generally to electronic devices, and more particularly to post-etch treatment of a semiconductor device.

BACKGROUND OF THE INVENTION

Modern electronic equipment such as televisions, telephones, radios and computers are generally constructed of solid state devices. Solid state devices are preferred in electronic equipment because they are extremely small and relatively inexpensive. Additionally, solid state devices are very reliable because they have no moving parts, but are based on the movement of charge carriers.

Solid state devices may be transistors, capacitors, resistors and the like. These devices are fabricated on a substrate and interconnected to form integrated circuits. Device fabrication typically includes depositing, patterning and etching conductor, semiconductor and insulator layers that make up features of the device.

Etching of metal and poly-metal gate structures is known to damage the underlying gate oxide, degrading its integrity and leading to device failure. To restore gate oxide integrity (GOI), post-gate-etch oxidation processes have been used. These processes, however, can oxidize the metal and poly-metal gate structures, resulting in high sheet resistance. To prevent gate oxidation, a selective oxidation process that uses $N_2$ diluted in $H_2/H_2O$ ambient has been proposed. Selective oxidation is unproven for use in large scale manufacturing and impractical because of the difficulty in achieving sufficient oxidation at the bottom of the gate to remove etch damage while preventing the gate from oxidizing.

SUMMARY OF THE INVENTION

In accordance with the present invention, a method for post-etch treatment of an etch-damaged semiconductor device is provided that substantially eliminates or reduces disadvantages and problems associated with previously developed methods. In particular, the present invention uses a protective cover to inhibit or prevent detrimental oxidation of the semiconductor device during a post-gate-etch oxidation process to repair etch damage to the device.

In one embodiment of the present invention, post-etch treatment of an etch-damaged semiconductor device includes forming a protective cover outwardly of an oxidizable section of the device. The protective cover is operable to at least inhibit oxidation of the section. While the oxidizable section is covered, an oxide structure is formed. The oxide structure is operable to at least ameliorate etch damage to the semiconductor device.

More specifically, in a particular embodiment, the semiconductor device may be a metal oxide semiconductor (MOS) device including a gate electrode having an oxidizable section and a gate oxide having an etch-damaged section. In this embodiment, the protective cover may be formed from a nitride layer outwardly of the gate electrode and the gate oxide. The protective cover is formed by etching the nitride layer until at least part of the etch-damaged section is exposed or removed. The oxide structure may be formed from part of a second oxide layer that is grown or deposited during a post-gate-etch oxidation process.

Technical advantages of the present invention include providing an improved method for post-etch treatment of a semiconductor device. In particular, an oxidizable section of the device is covered during a post-etch oxidation process to repair etch damage to the device. The cover inhibits or prevents detrimental oxidation of the oxidizable layer that can adversely affect the device. Accordingly, metal oxide semiconductor (MOS) or other devices having an oxidizable section may be manufactured with high oxide integrity and low sheet resistance. In addition, the method may be used in large scale device manufacturing.

Other technical advantages will be readily apparent to one skilled in the art from the following figures, description, and claims.

BRIEF DESCRIPTION OF THE DRAWINGS

For a more complete understanding of the present invention and the advantages thereof, reference is now made to the following description taken in conjunction with the accompanying drawings, in which.

DETAILED DESCRIPTION OF THE INVENTION

The preferred embodiments of the present invention and its advantages are best understood by referring to FIGS. 1 and 2 of the drawings, in which like numerals refer to like parts throughout the several views.

FIGS. 1A–F are a series of schematic cross-sectional diagrams illustrating post-etch treatment of a semiconductor device in accordance with one embodiment of the present invention. In this embodiment, the semiconductor device is a metal oxide semiconductor (MOS) device having a poly-metal gate. The method of the present invention may be used in connection with other suitable semiconductor devices that are subjected to post-etch oxidation and that have an oxidizable layer detrimentally affected by that post-etch oxidation.

Figure 1A:
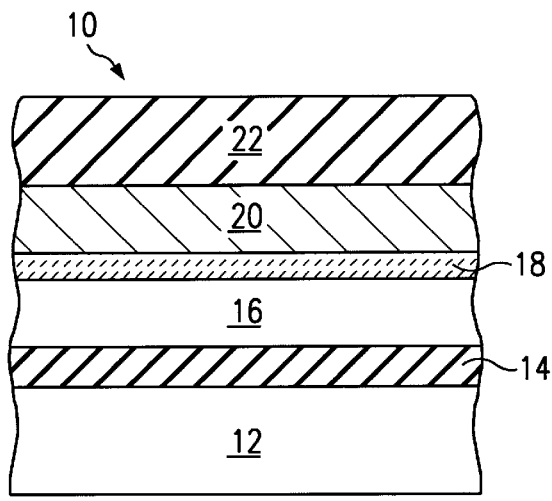
FIGS. 1A–F are a series of schematic cross-sectional diagrams illustrating post-etch treatment of a semiconductor device in accordance with one embodiment of the present invention.

Referring to FIG. 1A, an initial structure 10 of the MOS device includes an underlying substrate 12, an oxide layer 14 formed outwardly of the substrate 12, a polysilicon layer 16 formed outwardly of the oxide layer 14, a barrier layer 18 formed outwardly of the polysilicon layer 16, a metal layer 20 formed outwardly of the barrier layer 18 and an insulative layer 22 formed outwardly of the metal layer 20. These layers may comprise conventional materials for a poly-metal gate structure of a MOS device and may be conventionally formed in accordance with suitable integrated circuit fabrication techniques.

In a particular embodiment, the substrate 12 comprises a silicon (Si) wafer, the oxide layer 14 comprises silicon dioxide ($SiO_2$) deposited at a depth of about 90 angstroms, the polysilicon layer 16 comprises suitably doped silicon deposited to a depth of about 600 angstroms, the barrier layer 18 comprises titanium nitride (TiN) or tungsten nitride (WN) deposited to a depth of about 200 angstroms, the metal layer 20 comprises tungsten (W) deposited to a depth of about 1,000 angstroms, and the insulative layer 22 comprises silicon nitride ($Si_3N_4$) deposited to a depth of about 1,200 angstroms. The initial structure 10 may include other or different suitable layers or materials.

Figure 1B:
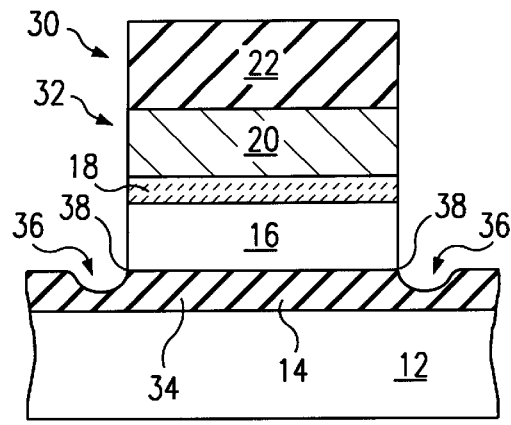

Referring to FIG. 1B, the initial device 10 is conventionally patterned and etched to form a gate insulator 30 from the insulative layer 22 and a poly-metal gate electrode 32 from the polysilicon, barrier and metal layers 16, 18 and 20. The etch may be an anisotropic etch or other suitable etch.

The oxide layer 14 forms a gate oxide 34 that insulates the gate electrode 32 from the substrate 12. During the gate etch, the gate oxide 34 is damaged. Etch damage is the removal or other degradation of a portion of a device or feature of the device. For the embodiment of FIG. 1B, an etch-damaged section 36 is formed in the gate oxide 34 proximate to a bottom edge 38 of the gate electrode 32 by the removal of oxide material during the gate etch. This degradation of gate oxide integrity (GOI) can lead to device failure.

As described in more detail below, a post-etch oxidation process is used to restore gate oxide integrity. In accordance with the present invention, a protective cover is formed over an oxidizable section of the gate electrode 32 during the post-etch oxidation process. The oxidizable section is a section of a device operable to be detrimentally oxidized by exposure to an oxidation process. Detrimental oxidation includes oxidation that adversely affects properties of the section. The protective cover inhibits or prevents such detrimental oxidation of the oxidizable section.

For the embodiment of FIG. 1B, the barrier layer 18 forms an oxidizable section of the gate electrode 32. The barrier layer 18 prevents interaction between the polysilicon layer 16 and the metal layer 20. The polysilicon layer 16 is reactive with the metal layer 20 and that contact will cause voiding and other deformities in the polysilicon layer 16. For the barrier layer 18, exposure to oxidation causes oxidation in the layer that leads to high sheet resistance in the gate electrode 32.

Figure 1C:
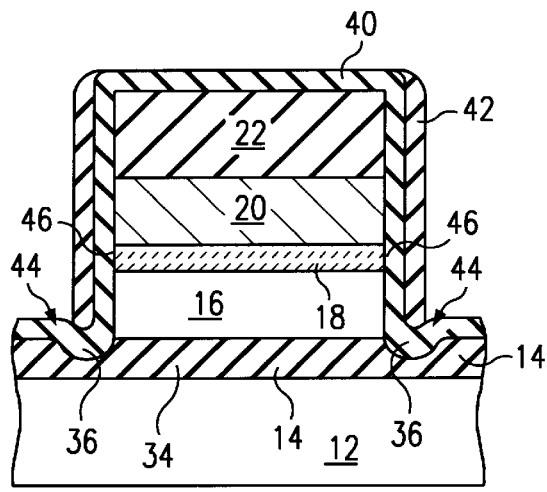

Referring to FIG. 1C, a protective layer 40 is formed outwardly of the gate electrode 32 and the gate oxide 34. The protective layer 40 comprises material that will inhibit or prevent oxidation of any underlying layer during a post-etch oxidation process. For the embodiment of FIG. 1C, the protective layer 40 comprises silicon nitride ($Si_3N_4$) that does not provide oxygen ($O_2$) to an underlying layer during an oxidation process. The silicon nitride is directly deposited onto the gate electrode 32 and the gate oxide 34 to a depth of about 50 angstroms using chemical vapor deposition (CVD) or other suitable technique.

A sidewall 42 is formed outwardly of a portion of the protective layer 40 adjacent sides of the gate electrode 32. The sidewall 42 exposes a portion 44 of the protective layer 40 proximate to the etch-damaged section 36 of the gate oxide 34 to allow that portion 44 to be removed without damage to a portion 46 of the protective layer 40 covering the oxidizable section of the gate electrode 32. Accordingly, the sidewall 42 should comprise a material from which an exposed portion of the protective layer 40 may be selectively etched. For the embodiment of FIG. 1C in which the protective layer 40 comprises nitride, the sidewall 42 may comprise an oxide, a doped oxide such as phosphorous doped silicon glass (PSG) or other suitable material. An oxide sidewall 42 is formed by conventionally depositing and etching back an oxide layer. The oxide sidewall 42 may have a thickness of about 100 angstroms.

Figure 1D:
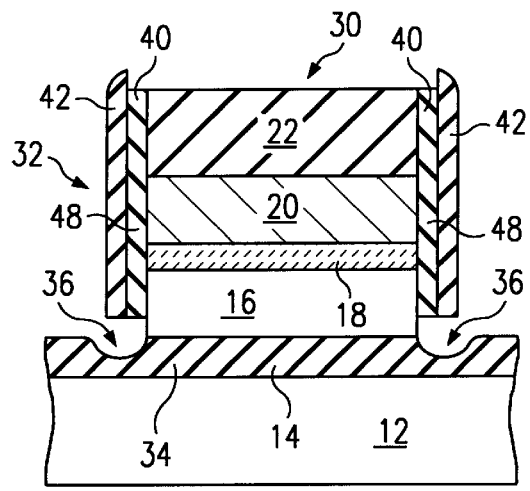

Referring to FIG. 1D, the protective layer 40 is isotropically etched until the etch-damaged section 36 of the gate oxide 34 is exposed. The remaining portion of the protective layer 40 forms a protective cover 48. The etch should be highly selective between the material of the protective layer 40 and the sidewall 42. Accordingly, the sidewall 42 protects the protective cover 48 during the etch and the oxidizable section remains insulated from post-etch oxidation. After the etch, the sidewall 42 may be removed using suitable integrated circuit processing techniques that do not damage the protective cover 48. In another embodiment, the sidewall 42 may remain as a sidewall insulator for the gate electrode 32.

Figure 1E:
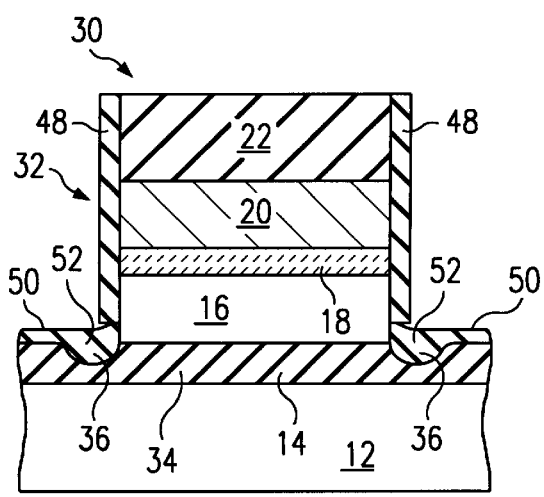

Referring to FIG. 1E, a second oxide layer 50 is formed outwardly of the etch-damaged section 36 of the gate oxide 34 by a conventional post-gate-etch oxidation, or reoxidation, process. During post-gate-etch oxidation, the protective cover 48 prevents or inhibits oxidation of the oxidizable section. Oxidation is prevented when the oxidizable section is not oxidized during the oxidation process. Oxidation is inhibited when the oxidizable section is not oxidized to an extent it would have been in the absence of the protective cover 48. For the embodiment of FIG. 1E, the nitride protective cover 48 prevents oxidation of the barrier layer 18. Accordingly, sheet resistance of the gate electrode 32 remains low.

The second oxide layer 50 includes an oxide structure 52 adjacent the etch-damaged section 36. The oxide structure 52 is operable to repair or ameliorate etch damage to the gate oxide 34. Etch damage is repaired when gate oxide integrity is restored to or improved from a pre-gate-etch state. Etch damage is ameliorated when the gate oxide integrity is improved from an initial post-gate-etch state, which will at least reduce device failures.

Figure 1F:
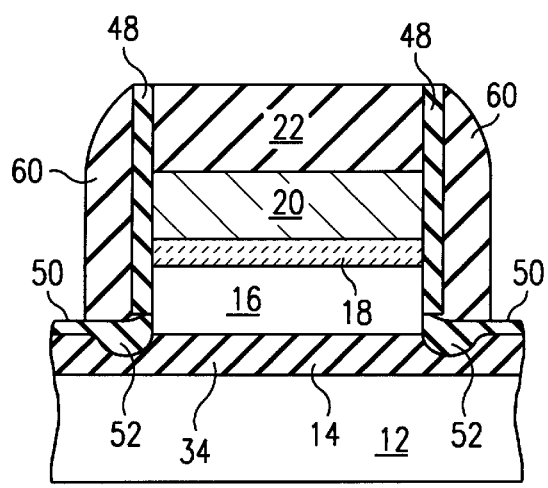

Referring to FIG. 1F, a sidewall insulator 60 is formed outwardly of the protective cover 48 to insulate the gate electrode 32. The sidewall insulator 60 may be conventionally formed and comprise nitride, oxide or other suitable insulative materials. In an embodiment in which the protective cover 48 does not comprise insulative materials, the protective cover 48 is removed prior to formation of the sidewall insulator 60. To avoid this extra step, the protective cover 48 preferably comprises an insulator.

Remaining features of the MOS device may be conventionally fabricated using suitable integrated circuit fabrication techniques. Thus, for example, the substrate 12 may be conventionally doped and insulated to form source, drain, extension, channel and other region and elements of the MOS device. The MOS device has low sheet resistance due to its unoxidized poly-metal gate electrode 32 and high gate oxide integrity due to the corrective oxide structure formed during post-gate-etch oxidation.

FIGS. 2A–D are a series of schematic cross-sectional diagrams illustrating post-etch treatment of a semiconductor device in accordance with another embodiment of the present invention. In this embodiment, the semiconductor device is a MOS device having a poly-metal gate. The method may be used in connection with other suitable semiconductor devices.

Figure 2A:
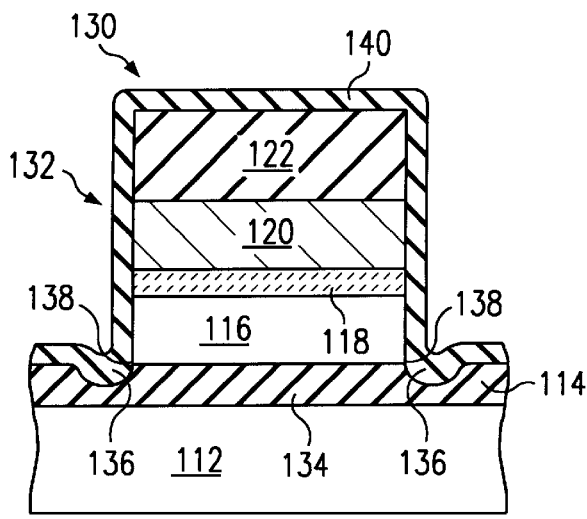
FIGS. 2A–D are a series of schematic cross-sectional diagrams illustrating post-etch treatment of a semiconductor device in accordance with another embodiment of the present invention.

Referring to FIG. 2A, the MOS device includes an underlying substrate 112, an oxide layer 114 formed outwardly of the substrate 112, a polysilicon layer 116 formed outwardly of the oxide layer 114, a barrier layer 118 formed outwardly of the polysilicon layer 116, a metal layer 120 formed outwardly of the barrier layer 118 and an insulative layer 122 formed outwardly of the metal layer 120. These layers may comprise conventional materials and may be conventionally formed as previously described for corresponding layers of FIGS. 1A–F.

The MOS device is conventionally patterned and etched to form a gate insulator 130 from the insulative layer 122 and a poly-metal gate electrode 132 from the polysilicon, barrier and metal layers 116, 118 and 120. The barrier layer 118 forms an oxidizable section of the gate electrode 132. Accordingly, exposure to an oxidation process adversely affects properties of the barrier layer 118. In particular, exposure of the barrier layer 118 to oxidation causes oxidation in the layer that leads to high sheet resistance in the gate electrode 130.

As previously discussed in connection with the oxide layer 14 of FIGS. 1A–F, the oxide layer 114 underlying the gate electrode 132 forms a gate oxide 134. The gate etch damages the gate oxide 134. For the embodiment of FIG. 2A, an etch-damaged section 136 is formed in the gate oxide 134 proximate to a bottom edge 138 of the gate electrode 132. This degradation of gate oxide integrity can lead to device failure.

A protective layer 140 is formed outwardly of the gate electrode 132 and the gate oxide 134. The protective layer comprises material that will inhibit or prevent oxidation of the underlying layer during a post-etch oxidation process. For the embodiment of FIG. 2A, the protective layer 140 comprises silicon nitride ($Si_3N_4$) that does not provide oxygen ($O_2$) to the barrier layer 118 during post-gate-etch oxidation. The silicon nitride is directly deposited onto the gate electrode 132 and the gate oxide 134 to a depth of about 50 angstroms using chemical vapor deposition (CVD) or other suitable technique.

Figure 2B:
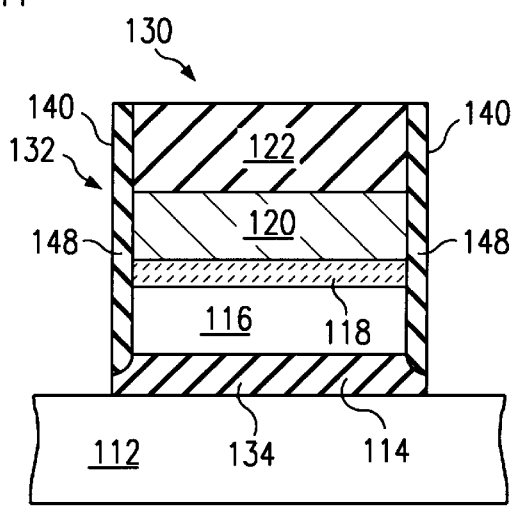

Referring to FIG. 2B, the protective layer 140 is anisotropically etched until at least part of the etch-damaged section 136 of the gate oxide 134 is removed. The remaining portion of the protective layer 140 forms a protective cover 148 that insulates the barrier layer 118 from post-gate-etch oxidation.

Figure 2C:
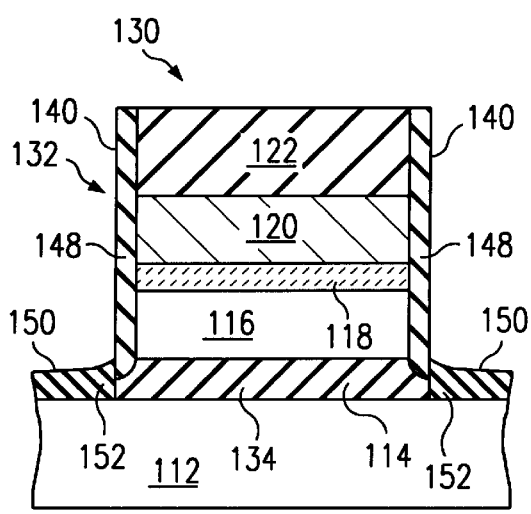

Referring to FIG. 2C, a second oxide layer 150 is formed outwardly of an exposed portion of the substrate 112 by a conventional post-gate-etch oxidation, or reoxidation, process. During post-gate-etch oxidation, the protective cover 148 prevents or inhibits oxidation of the oxidizable section of the gate electrode 132. As previously described in connection with FIGS. 1A–F, oxidation is prevented when the oxidizable section is not oxidized during the oxidation process. Oxidation is inhibited when the oxidizable section is not oxidized to an extent it would have been in the absence of the protective cover 148. For the embodiment of FIG. 2C, the nitride protective cover 148 prevents oxidation of the barrier layer 118. Accordingly, sheet resistance of the gate electrode 132 remains low.

The second oxide layer 150 includes an oxide structure 152 operable to repair or ameliorate etch damage to the gate oxide 134. Etch damage is repaired when gate oxide integrity is restored to or improved from a pre-gate-etch state. Etch damage is ameliorated when the gate oxide integrity is improved from an initial post-gate-etch state, which will at least reduce device failures. For the embodiment of FIG. 2C, etch damage is repaired by forming the oxide structure 152 in place of the removed part of the etch-damaged section 136 of the gate oxide 134. The oxide structure 152 is thicker than the removed etch-damaged section and accordingly provides improved insulation.

Figure 2D:
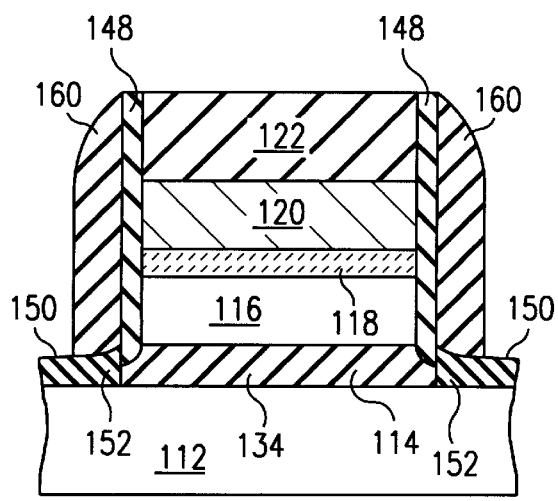

Referring to FIG. 2D, a sidewall insulator 160 is formed outwardly of the protective cover 148 to insulate the gate electrode 132. As previously described in connection with the sidewall insulator 60 of FIGS. 1A–F, the sidewall insulator 160 may be conventionally formed and comprise nitride or other suitable insulative material. In an embodiment in which the protective cover 148 does not comprise insulative material, the protective cover 148 is removed prior to the formation of the sidewall insulator 160. Accordingly, the protective cover 148 preferably comprises an insulator.

Remaining features of the MOS device may be conventionally fabricated using suitable integrated circuit fabrication techniques. The MOS device has low sheet resistance due to its unoxidized poly-metal gate electrode 132 and high gate oxide integrity due to the corrective oxide structure formed during post-gate-etch oxidation.

Although the present invention has been described with several embodiments, various changes and modifications may be suggested to one skilled in the art. It is intended that the present invention encompass such changes and modifications as found in the scope of the appended claims.

What is claimed is:

1. A method of fabricating a semiconductor device having an oxidizable section, comprising:

forming a stack of layers comprising an oxidizable layer, a polysilicon layer, and an oxide layer;

etching completely through the polysilicon layer and thereby causing etch damage to the oxide layer;

after the etching step, forming a protective cover over the oxidizable section of the semiconductor device, the protective cover operative to at least inhibit oxidation of the oxidizable section; and while the oxidizable section is covered, forming an oxide structure operable to at least ameliorate etch damage to the semiconductor device.

2. The method of claim 1, wherein the protective cover is operable to prevent oxidation of the oxidizable section during formation of the oxide structure.

3. The method of claim 1, wherein the oxide structure is operable to repair etch damage to the semiconductor device.

4. The method of claim 1, wherein the protective cover comprises nitride.

5. The method of claim 1, wherein the semiconductor device comprises a gate electrode including the oxidizable section and the oxide layer including an etch-damaged section, wherein the step of forming the protective cover comprises:

forming a protective layer outwardly of the gate electrode and the oxide layer; and exposing at least part of the etch-damaged section by etching back the protective layer.

6. The method of claim 5, wherein the protective layer comprises nitride.

7. The method of claim 1, wherein the semiconductor device comprises a gate electrode including the oxidizable section and the oxide layer including an etch-damaged section, wherein the step of forming the protective cover comprises:

forming a nitride layer outwardly of the gate electrode and the oxide layer; and anisotropically etching the nitride layer and the oxide layer until at least part of the etch-damaged section of the oxide layer is removed.

8. The method of claim 7, forming the oxide structure comprising forming a second oxide layer in the place of the removed part of the etch-damaged section.

9. The method of claim 1, wherein the semiconductor device comprises a gate electrode including the oxidizable section and the oxide layer including an etch-damaged section, wherein the step of forming the protective cover comprises:

forming a nitride layer outwardly of the gate electrode and the oxide layer;

forming an oxide sidewall outwardly of a portion of the nitride layer adjacent the gate electrode, the oxide sidewall exposing a second portion of the nitride layer adjacent the etch-damaged section of the oxide layer; and isotropically etching the second portion of the nitride layer until at least part of the etch-damaged section of the oxide layer is exposed.

10. The method of claim 9, forming the oxide structure comprising forming a second oxide layer adjacent at least part of the exposed portion of the etch-damaged section.

11. The method of claim 1, wherein the oxidizable section is a barrier layer disposed between a metal layer and a metal reactive layer.

12. The method of claim 11, wherein the metal reactive layer comprises polysilicon.

13. The method of claim 1, wherein the semiconductor device is a metal oxide semiconductor (MOS) device and the oxidizable section is a barrier layer of the MOS device.

14. The method of claim 1, wherein the semiconductor device is a metal oxide semiconductor (MOS) device having a poly-metal gate and the oxidizable section is a barrier layer of the poly-metal gate.

15. The method of claim 1, further comprising removing the protective cover.

16. The method of claim 1, further comprising forming a nitride sidewall over the protective cover.

17. A method for fabricating a semiconductor device, comprising the steps of:

forming a stack of layers comprising an oxidizable layer, a polysilicon layer, and an oxide layer;

creating a gate electrode by etching the stack of layers completely through the polysilicon layer and thereby creating an oxidizable section from the oxidizable layer and causing etch damage to the oxide layer;

forming a protective cover outwardly of the oxidizable layer, the protective cover operative to at least inhibit oxidation of the oxidizable layer; and while the oxidizable layer is covered, forming an oxide structure to at least ameliorate etch damage to the oxide layer.

18. The method of claim 17, wherein the protective cover is operable to prevent oxidation of the oxidizable layer.

19. The method of claim 17, wherein the oxide structure is operable to repair etch damage to the semiconductor device.

20. The method of claim 17, wherein the protective cover comprises nitride.

* * * * *